United States Patent
Kaneta

(10) Patent No.: US 11,212,528 B2
(45) Date of Patent: Dec. 28, 2021

(54) BIT STRING BLOCK ENCODER DEVICE, BLOCK DECODER DEVICE, INFORMATION PROCESSING DEVICE, PROGRAM, BLOCK ENCODING METHOD AND BLOCK DECODING METHOD

(71) Applicant: Rakuten Group, Inc., Tokyo (JP)

(72) Inventor: Yusaku Kaneta, Tokyo (JP)

(73) Assignee: Rakuten Group, Inc., Tokyo (JP)

( * ) Notice: Subject to any disclaimer, the term of this patent is extended or adjusted under 35 U.S.C. 154(b) by 684 days.

(21) Appl. No.: 16/078,123

(22) PCT Filed: Feb. 25, 2016

(86) PCT No.: PCT/JP2016/055583
§ 371 (c)(1),
(2) Date: Aug. 21, 2018

(87) PCT Pub. No.: WO2017/145317
PCT Pub. Date: Aug. 31, 2017

(65) Prior Publication Data
US 2021/0195184 A1   Jun. 24, 2021

(51) Int. Cl.
*H04N 11/02*  (2006.01)
*H04N 19/119*  (2014.01)
(Continued)

(52) U.S. Cl.
CPC ......... *H04N 19/119* (2014.11); *H04N 19/146* (2014.11); *H04N 19/176* (2014.11); *H04N 19/184* (2014.11)

(58) Field of Classification Search
CPC .................................................. H04N 19/119
(Continued)

(56) References Cited

U.S. PATENT DOCUMENTS

| 4,907,194 A | * | 3/1990 | Yamada | G06F 16/90344 365/49.17 |
| 5,596,640 A | * | 1/1997 | Ohta | H04N 1/4413 358/426.12 |

(Continued)

FOREIGN PATENT DOCUMENTS

| WO | 2015/151444 A1 | 10/2015 |
| WO | 2015/173870 A1 | 11/2015 |

OTHER PUBLICATIONS

Rajeev Raman et al., "Succinct Indexable Dictionaries with Applications to Encoding k-ary trees, Prefix Sums and Multisets", ACM Transactions on Algorithms, Nov. 2007, vol. 3, No. 4, Article 43.

(Continued)

*Primary Examiner* — Leron Beck
(74) *Attorney, Agent, or Firm* — Sughrue Mion, PLLC

(57) ABSTRACT

An efficient encoding/decoding method for block compression for RRR, provides an area-saving method that operates at high speed even with a dense bit string. A block encoding device generates blocks having a first block length by dividing an input bit string into a plurality of blocks, determines a first weight of each block from the number of 1 values included in the bit string, divides each block into small blocks having a second block length, determines a first order of the blocks in a set in which predetermined bit strings having the first block length and the first weight are arranged in a predetermined order on the basis of the weight and value of each of the small blocks, and generates block encoding data by converting the bit string of each block into the values of the determined first weight and first order.

15 Claims, 11 Drawing Sheets

(51) Int. Cl.
*H04N 19/146* (2014.01)
*H04N 19/176* (2014.01)
*H04N 19/184* (2014.01)

(58) Field of Classification Search
USPC ........................................ 375/240.01–240.29
See application file for complete search history.

(56) References Cited

U.S. PATENT DOCUMENTS

| | | | | |
|---|---|---|---|---|
| 5,805,304 | A * | 9/1998 | Sekine | .................... G06K 15/02 |
| | | | | 358/1.2 |
| 2008/0292100 | A1* | 11/2008 | Komano | ................. H04L 9/003 |
| | | | | 380/29 |
| 2017/0132262 | A1 | 5/2017 | Okajima et al. | |
| 2017/0169129 | A1 | 6/2017 | Kaneta | |

OTHER PUBLICATIONS

Gonzalo Navarro et al., "Fast, Small, Simple Rank/Select on Bitmaps", In Proc. 11th SEA, {306, 2012, 12 pages.
Yusaku Kaneta, "Jitsuyoteki na Asshuku Rank/Select Jisho", IPSJ SIG Notes, Sep. 28, 2015, 8 pages, vol. 2015-AL-154, No. 1.
Kunihiko Sadakane, "Succinct Data Structures for Large-Scale Data Processing", IPSJ Magazine, Aug. 15, 2007, pp. 899 to 902, vol. 48, No. 8.
International Search Report for PCT/JP2016/055583 dated May 17, 2016 [PCT/ISA/210].

* cited by examiner

| NODE POSITION | 0 | 1 | 2 | 3 | | | 4 | 5 | | 6 | 7 | | | | |
|---|---|---|---|---|---|---|---|---|---|---|---|---|---|---|---|
| BIT POSITION | 0 | 1 | 2 | 3 | 4 | 5 | 6 | 7 | 8 | 9 | 10 | 11 | 12 | 13 | 14 | 15 |
| BLOCK NUMBER | 0 | | | | | | | 1 | | | | | | | | |
| BP REPRESENTATION | ( | ( | ( | ) | ) | ) | ) | ( | ) | ) | ( | ( | ) | ) | ) | ) |
| BIT STRING | 1 | 1 | 1 | 0 | 0 | 0 | 0 | 1 | 0 | 0 | 1 | 1 | 0 | 0 | 0 | 0 |

| 0:(w=0) |
| --- |
| 3:(w=1) |
| 12:(w=2) |

702

| C(3,0)=1 |
| --- |
| C(3,1)=3 |
| C(3,2)=3 |

704

| 0 | $BITS_{k=3}(0,0) = 000$ |
| --- | --- |
| 1 | $BITS_{k=3}(1,0) = 001$ |
| 2 | $BITS_{k=3}(1,1) = 010$ |
| 3 | $BITS_{k=3}(1,2) = 100$ |
| 4 | $BITS_{k=3}(2,0) = 011$ |
| 5 | $BITS_{k=3}(2,1) = 101$ |
| 6 | $BITS_{k=3}(2,2) = 110$ |
| 7 | $BITS_{k=3}(3,0) = 111$ |

703

| $OD_{sw}(000) = 0$ |
| --- |
| $OD_{sw}(001) = 0$ |
| $OD_{sw}(010) = 1$ |
| $OD_{sw}(011) = 0$ |
| $OD_{sw}(100) = 2$ |
| $OD_{sw}(101) = 1$ |
| $OD_{sw}(110) = 2$ |
| $OD_{sw}(111) = 0$ |

705

| $W_{k=3}(000) = 0$ |
| --- |
| $W_{k=3}(001) = 1$ |
| $W_{k=3}(010) = 1$ |
| $W_{k=3}(011) = 2$ |
| $W_{k=3}(100) = 1$ |
| $W_{k=3}(101) = 2$ |
| $W_{k=3}(110) = 2$ |
| $W_{k=3}(111) = 3$ |

FIG. 7

BIT STRING BLOCK ENCODER DEVICE, BLOCK DECODER DEVICE, INFORMATION PROCESSING DEVICE, PROGRAM, BLOCK ENCODING METHOD AND BLOCK DECODING METHOD

CROSS REFERENCE TO RELATED APPLICATIONS

This application is a National Stage of International Application No. PCT/JP2016/055583 filed Feb. 25, 2016.

TECHNICAL FIELD

The present invention relates to a block encoding device, a block decoding device, an information processing device, a program, a block encoding method, and a block decoding method.

BACKGROUND ART

In an application of handling large-scale data, the size of a working area also becomes a problem along with a speed. In a case where the working area does not fit in a main memory, swapping occurs, and thus, the speed considerably decreases. For this reason, in a data structure, it is required not only to enable high-speed search but also to have a small working area amount.

Therefore, recently, in order to perform large-scale data processing on the main memory with a high speed without referring to a secondary storage device (a hard disk or the like), a short data structure in which a high-speed manipulation is achieved in a state where data is represented in a size close to an information theoretic lower limit, and a compression data structure in which a high-speed manipulation is achieved in a state where data is compressed into a size close to entropy, have been studied from both viewpoints of theory and practical use.

A Rank/Select dictionary is a data structure in which a $rank_b(x,B)$ on an input bit string $B[0 \ldots n-1]$ (a manipulation of obtaining the number of $b \in \{0, 1\}$ in $B[0 \ldots x]$) and $select_b(i,B)$ (a manipulation of obtaining a position of the i-th $b \in \{0, 1\}$ from a head of B) are achieved. Raman et al. have proposed a data structure (RRR) in which the manipulation described above is achieved for a constant time in a state where an input bit string is compressed (Non-Patent Document 1). In such a data structure, the input bit string is divided into fixed-length blocks having a length of $\log(n)/2$, and each of the blocks is encoded as a pair of a weight (a fixed-length integer indicating the number of 1 in the block) and an order (a variable-length integer uniquely allocated into a block group having the same weight).

Block encoding and block decoding of a reverse manipulation thereof can be theoretically achieved for a constant time by using an auxiliary area asymptotically smaller than n. On the other hand, the auxiliary area is too large to ignore, from the viewpoint of practical use. Therefore, the realization of efficient block encoding and block decoding is an important subject in order to implement the data structure described above.

In addition, an implementation method of Navarro and Providel (hereinafter, referred to as RRR-NP) has been proposed as a practical implementation method of the RRR (Non-Patent Document 2). In the method proposed in Non-Patent Document 2, actual performance of the RRR considerably depends on a realization method of block compression.

Non-Patent Document 1: R. Raman, V. Raman, S. R. Satti: Succinct indexable dictionaries with applications to encoding k-ary trees, prefix sums and multisets. ACM Transactions on Algorithms, Volume 3, Number 4, Non-Patent Document 2: G. Navarro, E. Providel: Fast, small, simple rank/select on bitmaps, In Proc. 11th SEA, pp. 295{306, 2012.

DISCLOSURE OF THE INVENTION

Problems to be Solved by the Invention

Objects of the present invention are to provide efficient encoding method and decoding method for block compression in order to implement RRR in a practical manner, and to provide RRR implementation that provides high-speed and area-saving encoding method and decoding method, and that operates at a high speed even with respect to a dense bit string.

Means for Solving the Problems

A block encoding device corresponding to one of embodiments of the present invention for attaining the objects described above, includes: one or more processors; and one or more memories storing a program, in a case where the program is executed by the one or more processors, the program allows the one or more processors to execute an operation of, dividing an input bit string into a plurality of blocks having a first block length, and generating blocks to be processed, determining a first weight of the blocks to be processed from the number of 1 values included in a bit string of the blocks to be processed, dividing the blocks to be processed into small blocks having a second block length, and determining a first order of the blocks to be processed in a set in which predetermined bit strings having the first block length and the first weight are arranged in a predetermined order, on the basis of a weight and a value of each of the small blocks, and converting the bit string of the blocks to be processed into values of the determined first weight and first order, and generating block encoding data.

A block decoding device corresponding to one of the embodiments of the present invention for attaining the objects described above, includes: one or more processors; and one or more memories storing a program, in a case where the program is executed by the one or more processors, the program allows the one or more processors to execute an operation of decoding a bit string of blocks to be processed from block encoding data which is generated by performing block encoding with respect to the bit string of the blocks to be processed having a first block length and a first weight, the block encoding data includes the first weight, and a first order of the blocks to be processed in a set in which predetermined bit strings having the first block length and the first weight are arranged in a predetermined order, and the operation of decoding the bit string includes an operation of, determining a second weight of a first small block including the highest-order bit of the blocks to be processed, in a case where the blocks to be processed are divided into small blocks having a second block length, determining a first number of bit strings which have a weight smaller than the second weight, and are positioned before the blocks to be processed in the predetermined order, with respect to the first small block of the bit string, in the set, determining a bit string of the first small block of the blocks to be processed, and a second number of bit strings including the first small block having the same weight as that of the first small block of the blocks to be processed and a different value, in the set, on the basis of a difference between the first order and the first number, and determining a bit string of a second small block of the blocks to be processed, on the basis of a difference between the first weight and the second weight, and a difference between the first order, and the first number and the second number, in the set.

Effects of the Invention

According to the present invention, it is possible to provide RRR implementation that provides high-speed and area-saving encoding method and decoding method, and that operates at a high speed even with respect to a dense bit string. Accordingly, it is possible to prevent a decrease in a speed by increasing a data amount contained in a main memory, and to realize high-speed data processing.

BRIEF DESCRIPTION OF THE DRAWINGS

FIG. 4C is a diagram for illustrating the information represented in the tree structure to which the compression data structure can be applied, corresponding to the embodiment of the present invention.

FIG. 7 is a diagram for illustrating each table referred to the block encoding processing and block decoding processing, corresponding to the embodiment of the present invention.

PREFERRED MODE FOR CARRYING OUT THE INVENTION

Figure 1:
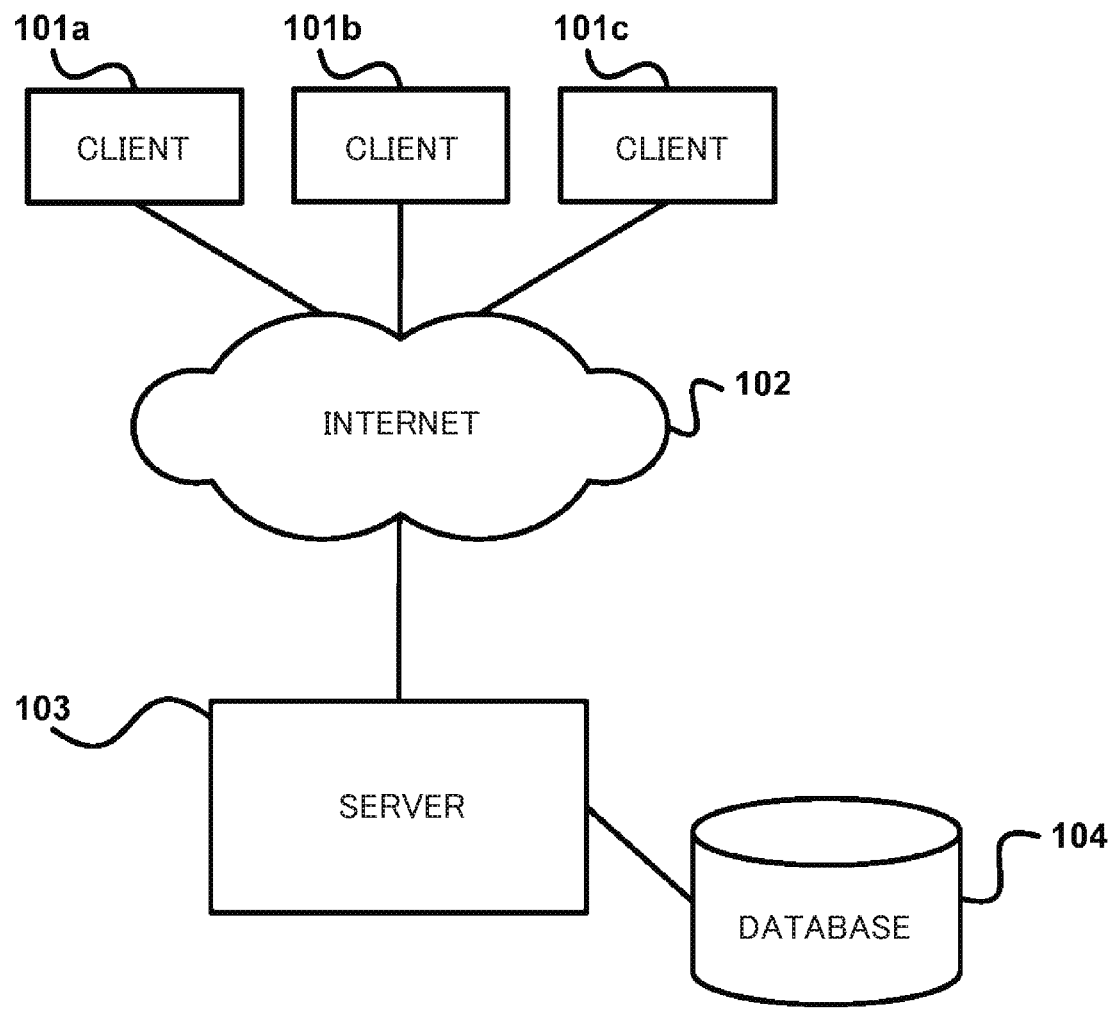
FIG. 1 is a diagram illustrating a configuration example of the entire system corresponding to an embodiment of the present invention.

Hereinafter, embodiments according to the present invention will be described by using the drawings. Furthermore, the following embodiments are merely examples, and the present invention is not limited thereto. For this reason, other configurations may be adopted insofar as a characteristic configuration of the present invention can be applied. In constituents to be described, the same reference numerals are applied to the constituents having the same function, and the description thereof will be omitted. Hereinafter, a system in which data items in a semi-structured text format such as XML, and indices thereof are distributed, and the data items are processed on a reception side, will be mainly described.

<System Configuration>

FIG. 1 is a block diagram illustrating an overall configuration of an information processing system corresponding to this embodiment. The information processing system is configured such that clients 101a, 101b, and 101c, which are user terminals (hereinafter, collectively referred to as a "client 101") and a server 103 are connected to an internet 102, and intercommunication can be performed. A database 104 is connected to the server 103.

The client 101 is a user terminal manipulated by a user, or an information processing device. The client 101 is capable of accessing a site provided by the server 103 according to a user manipulation. The client 101 is capable of requesting the server 103 (also referred to as an "access request") site information (web page information). In the case of receiving the site information transmitted from the server 103 according to the request, the client 101 displays the received site information on a display.

The client 101, for example, includes a laptop computer, a desktop computer, a personal digital assistance, a mobile phone, a smart phone, a tablet terminal, and the like. A so-called internet browser software (which is capable of reproducing streaming contents in plug-in) is installed in the client 101.

The client 101 is connected to the internet 102 according to a wireless data communication method such as a wireless LAN and an LTE. Furthermore, the client 101 may further be configured such that the client 101 is capable of accessing the network 102, by the LAN including a network cable such as Ethernet (Registered Trademark). The internet 102 is a network in which networks of all over the world are connected to each other, and for example, may be a network which can be connected only in a specific organization such as an intranet.

The server 103 may be an information processing device providing an XML file in a portal site such as an online shopping site. The user of the client 101 may be a registered user of the portal site (hereinafter, the registered user will be simply referred to as a user). The server 103 manages a database 104 in which various site information items are registered, and receives the access from the client 101.

The database 104 is an information processing device in which predetermined database software is installed, and manages various data items. The database 104 manages information of a document file for disclosing a predetermined web site on the internet 102. The document file includes a file used in a specific application (for example, MS Word or the like), in addition to an HTML file and a PDF file. The database 104 is continually updated, and stores newest information.

Furthermore, herein, for convenience, it is described that each of the server 103 and the database 104 is achieved by a physically independent information processing device, but the embodiments of the present invention are not limited thereto. For example, the server 103 and the database 104 may be achieved by a single information processing device. On the other hand, each device such as an authentication server 103 may have a redundant configuration or a distributed configuration by a plurality of information processing devices. In addition, it is described that the database 104 is connected to the server 103 through the LAN or the like, and for example, communication between the database 104 and the server 103 may be performed through the internet 102 or the intranet (not illustrated).

<Hardware Configuration of Device>

Figure 2A:
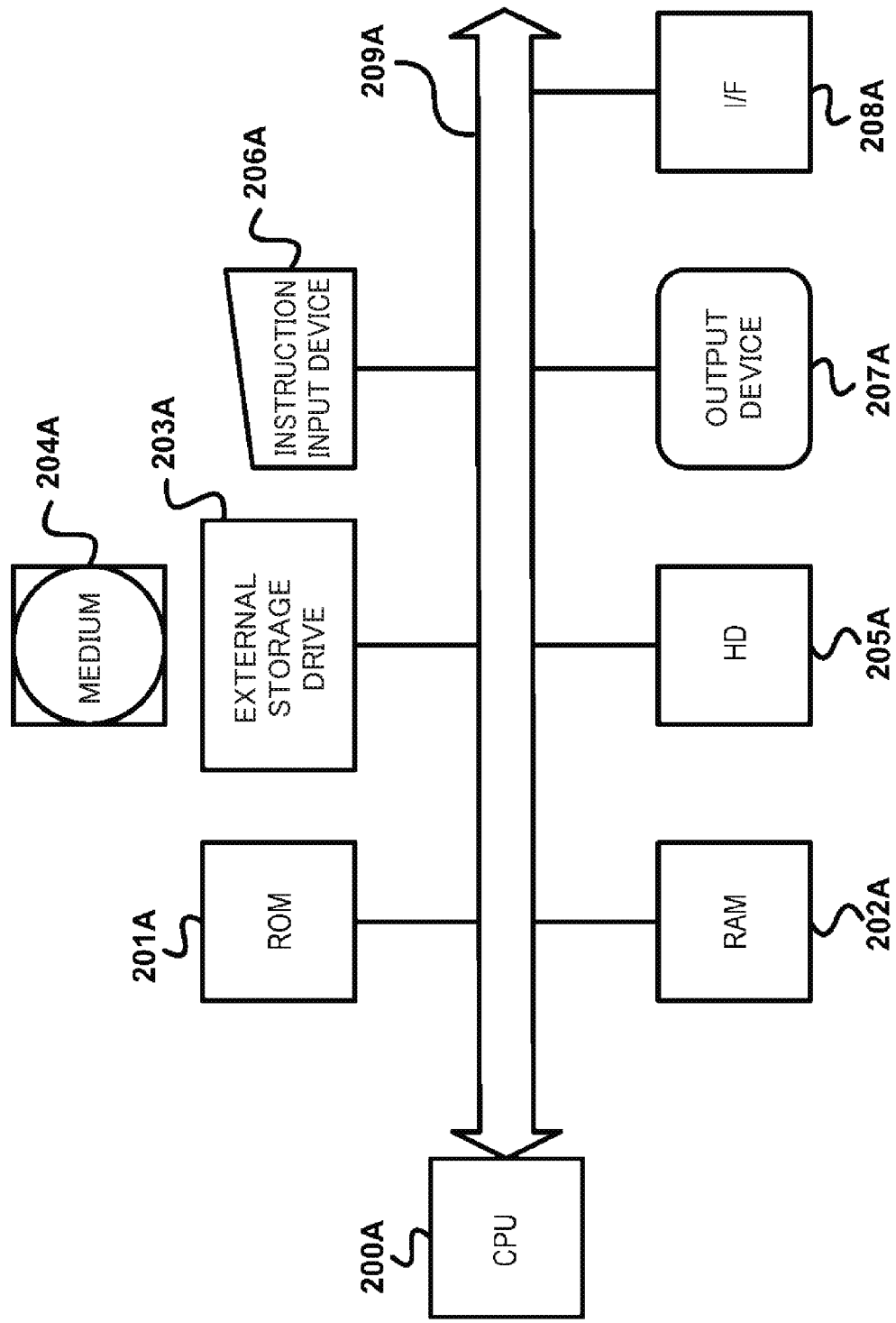
FIG. 2A is a block diagram illustrating an example of a hardware configuration of a client 101 corresponding to the embodiment of the present invention.

Next, a hardware configuration of each of the devices configuring the information processing system corresponding to this embodiment will be described. FIG. 2A is a block diagram illustrating an example of a hardware configuration of the client 101. The database 104 as the information processing device described above may be configured to have the similar or equivalent hardware configuration.

Figure 2B:
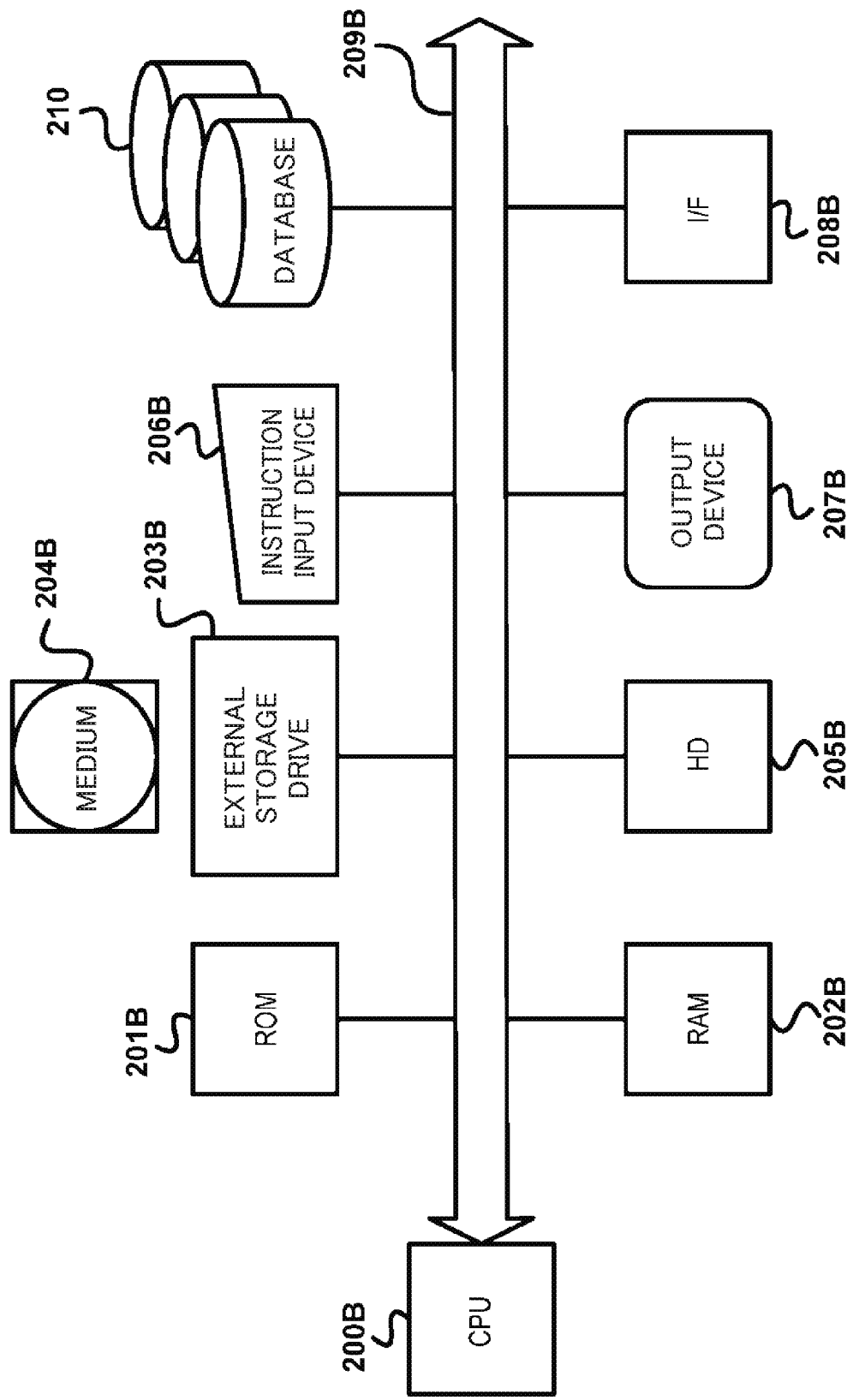
FIG. 2B is a block diagram illustrating an example of a hardware configuration of a server 103 corresponding to the embodiment of the present invention.

FIG. 2B is a block diagram illustrating an example of a hardware configuration of the server 103 as the information processing device corresponding to the embodiment of the present invention. Functions and use applications of a CPU, a ROM, a RAM, an external storage drive, a medium, an HD, an instruction input device, an output device, an I/F, and a system bus, and relationships thereof are similar or equivalent to each other according to the description using FIG. 2A. In FIG. 2B, note that a database 210 is connected to a system bus 209B. Here, the database 210 corresponds to the database 104. Hereinafter, each constituent of FIG. 2A and FIG. 2B will be collectively described.

In FIG. 2A and FIG. 2B, a CPU 200A (200B) executes an application program, an operating system (OS), a control program, or the like, stored in a hard disk device (hereinafter, referred to as an HD) 205A (205B), and performs control of temporarily storing information, a file, or the like, which is necessary for the execution of the program, in an RAM 202A (202B). The CPU 200A (200B) may be configured of a single processor, or may be configured of a plurality of processors. The CPU 200A (200B) decompresses the site information (the XML file) which is received from the server 103 and is stored in the RAM 202A, and converts the site information into data in the format where the data can be displayed on a display of an output device 207A. Further, the CPU 200A (200B) controls data transmission and reception with respect to the external device through an interface 208A (208B), executes analysis processing with respect to data received from the external device, and generates data to be transmitted to the external device (including a processing request or a data request). Furthermore, the CPU 200A (200B) controls the entire device by executing a corresponding processing program, and thus, processing to be described with reference to FIG. 3 to FIG. 8 described below, is also achieved.

The ROM 201A (201B) stores various data items such as a basic I/O program and various application programs, therein. The RAM 202A (202B) temporarily stores various data items, and functions as a main memory, a working area, or the like of the CPU 200A (200B).

An external storage drive 203A (203B) is an external storage drive for realizing an access with respect to a recording medium, and is capable of loading a program or the like, which is stored onto a medium (a recording medium) 204A (204B), in this computer system. Furthermore, for example, Floppy (Registered Trademark) disk (FD), a CD-ROM, a CD-R, a CD-RW, a PC card, a DVD, Blu-ray (Registered Trademark), an IC memory card, an MO, a memory stick, and the like can be used as the medium 204A (204B).

In this embodiment, a hard disk (HD) functioning as a large-capacity memory, is used as the external storage device 205A (205B). The HD 205A (205B) stores an application program, an OS, a control program, a related program, and the like. Furthermore, a non-volatile storage device such as Flash (Registered Trademark) memory, may be used instead of the hard disk.

An instruction input device 206A (206B) corresponds to a keyboard, a pointing device (a mouse or the like), a touch panel, or the like. The user performs an input instruction of a command or the like of controlling the device, with respect to the client 101, by using the instruction input device 206A (206B). The output device 207A (207B) outputs a command input from the instruction input device 206A (206B), or a response output or the like of the client 101 or the server 103, with respect to the command. The output device 207A (207B) includes a display, a speaker, a headphone terminal, and the like. The system bus 209A (209B) controls a data flow in the information processing device.

The interface (hereinafter, referred to as an I/F) 208A (208B) has a function of mediating a data exchange with respect to the external device. For example, in the client 101, the external device is the server 103 or the like, and in the server 103, the external device is the client 101 or the like. Specifically, the I/F 208A (208B) is capable of including a wireless communication module, and the module is capable of including a known circuit mechanism such as an antenna system, an RF transmitter-receiver, one or more amplifiers, a tuner, one or more oscillators, a digital signal processor, a CODEC chipset, a subscriber identification module card, and a memory. In addition, the I/F 208A (208B) is capable of including a wired communication module for wired connection. The wired communication module is capable of performing communication with respect to the other device through one or more external ports. In addition, various software components processing data can be included. The external port is combined with the other device directly through Ethernet, a USB, IEEE1394, or the like, or indirectly through a network. Furthermore, it is possible to obtain a configuration as a substitute of a hardware device, by software of realizing functions equivalent to those of the devices.

Whenever a corresponding program is operated in order to execute processing corresponding to this embodiment, the program may be loaded onto the RAM 202A (202B) from the HD 205A (205B) in which the program is installed in advance. In addition, it is also possible to record the program according to this embodiment in the ROM 201A (201B) to form a part of a memory map, and to directly execute the program by the CPU 200A (200B). Further, the corresponding program and the related data can be executed by being directly loaded onto the RAM 202A (202B) from the medium 204A (204B).

Figure 3:
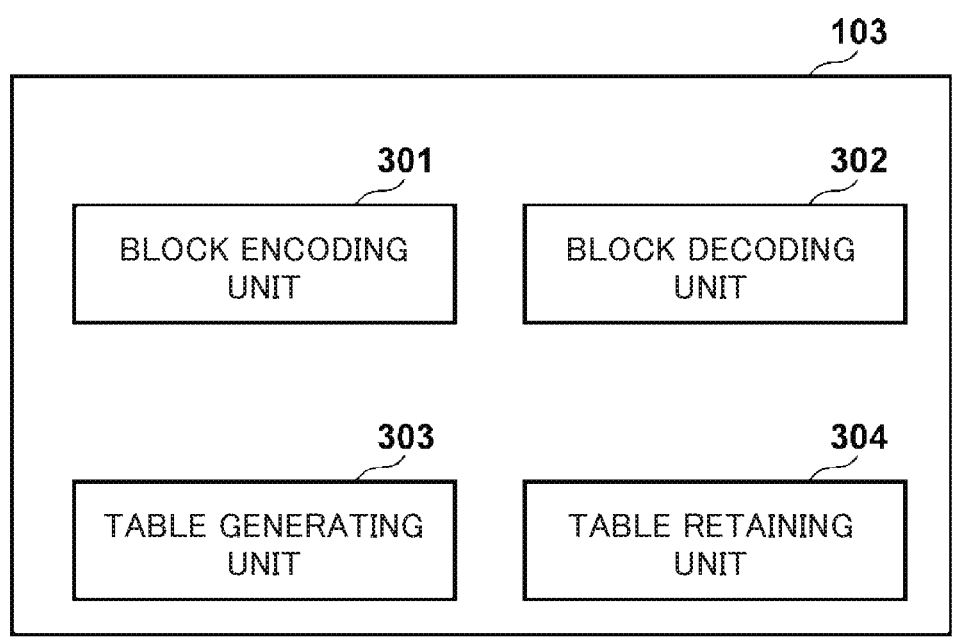
FIG. 3 is a block diagram illustrating an example of a functional configuration of the server 103 corresponding to the embodiment of the present invention.

FIG. 3 is a functional block diagram of the server 103 according to this embodiment. Each block illustrated here, indicates various control and processing functions which are realized by executing a predetermined program retained in the ROM 201A, the RAM 202B, and the HD 205B of the server 103 by the CPU 200B of the server 103.

A block encoding unit 301 performs block encoding processing of dividing an input bit string into bit strings having a block length n, and of converting each of the blocks into values of a weight w and an order O. Block encoding data is stored in the working area of the RAM 202B. The details of the block encoding processing will be described below, with reference to FIG. 5 to FIG. 7.

A block decoding unit 302 performs block decoding processing of decoding the block encoding data which is obtained by the block encoding processing in the block encoding unit 301, and is stored in the working area of the RAM 202B, and of restoring the original bit string. The details of the block decoding processing will be described below, with reference to FIG. 7 to FIG. 8.

A table generating unit 303 generates information of a table which is referred to in the block encoding processing and the block decoding processing to be executed in the block encoding unit 301 and the block decoding unit 302. The generation of the table information will be described below, with reference to FIG. 5.

A table retaining unit 304 retains the information of the table which is referred to in the block encoding processing and the block decoding processing to be executed in the block encoding unit 301 and the block decoding unit 302. The details of the table information and a using method thereof will be described below, with reference to FIG. 5 to FIG. 8.

Figure 4A:
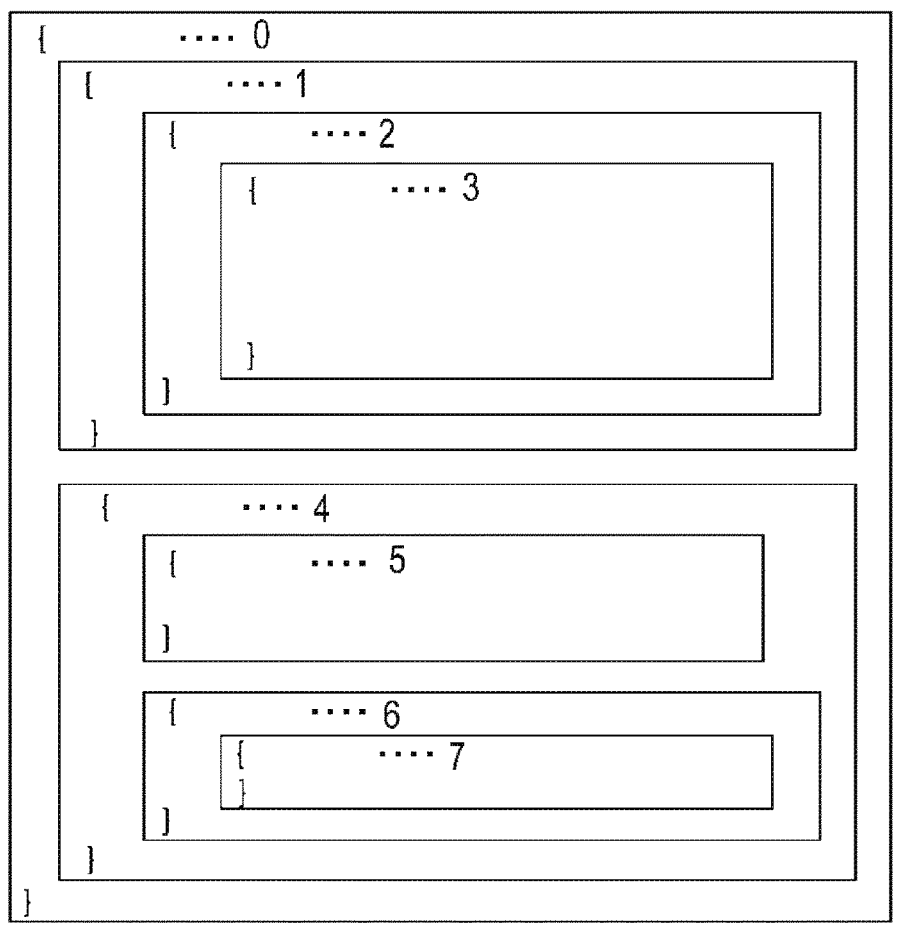
FIG. 4A is a diagram for illustrating information represented in a tree structure to which a compression data structure can be applied, corresponding to the embodiment of the present invention.
Figure 4B:
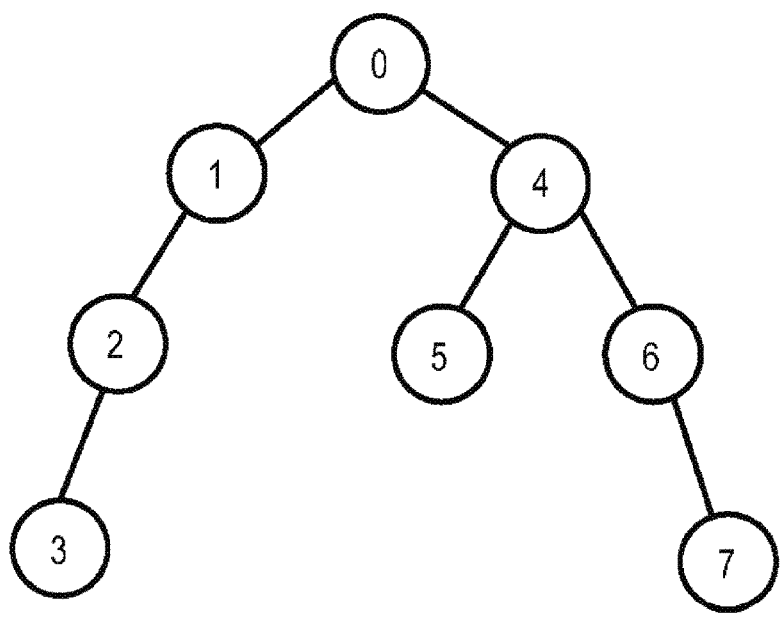
FIG. 4B is a diagram for illustrating the information represented in the tree structure to which the compression data structure can be applied, corresponding to the embodiment of the present invention.

Next, information which is represented in a tree structure to which a compression data structure corresponding to the embodiment of the present invention can be applied, will be described. FIG. 4A to FIG. 4C are diagrams illustrating an example of data which is represented in the tree structure such as XML or JSON. FIG. 4A is a diagram illustrating an example of semi-structured text data. The semi-structured text data illustrated in FIG. 4A is an example of data in the format of JSON. It is known that the semi-structured text data generally corresponds to a tree structure including a plurality of nodes. In the semi-structured text data, each of the plurality of nodes is indicated by a character string from each start point to each end point in the semi-structured text data. For example, the start point and the end point may be indicated by a symbol (in the example of FIG. 4A, "{" and "}", respectively), or the start point and the end point may be indicated according to any other syntactic rules. In addition, a character string of a child node of a certain node may be inserted into a character string of the certain node, and may be included in a child structure. In addition, a character string of a lower-order node such as a grandchild node, may be included in the character string of the child node. A circled number and a broken line of FIG. 4A are a code and a line for describing the semi-structured text data, and the circled number indicates a number of a node corresponding to a position of parentheses which are connected to each other through the broken line.

FIG. 4B is a diagram illustrating a tree structure corresponding to the semi-structured text data of FIG. 4A. A node with a number 0 is the highest-order node, and a child node thereof is a node with numbers 1 and 4. In addition, the child node of the node with the number 1 is a node with a number 2, and the child node with the number 2 is a node with a number 3. A child node of the node with the number 4 is a node with numbers 5 and 6, and a child node with a number 6 is a node with a number 7.

FIG. 4C is a table illustrating the tree structure illustrated in FIG. 4B as parentheses tree representation (BP representation) and a bit string. The bit string is data to be processed in this embodiment, and a node position, a bit position, and the BP representation describe the bit string.

The bit string illustrated in FIG. 4C can be generated on the basis of text data which is represented in the tree structure such as XML or JSON. "(" and ")" in the row of the BP representation (indicating the parentheses of the parentheses tree representation in the case of being simply referred to as "parentheses" hereinafter) respectively indicate a start point and an end point of each node of the text data. Therefore, "1" and "0" of the bit string respectively indicate a start point and an end point of the corresponding node. Furthermore, in FIG. 4C, the bit position is a number starting with 0. On the other hand, in this embodiment, the input bit string is divided into blocks to be processed having a fixed-length n, and in FIG. 4C, one block is set to 8 bits, and a block number is set to a number starting with 0. The number of bits included in one block may be a number of power-of-two other than 8, or may be the other arbitrary number. Hereinafter, the number of bits of the block will be referred to as a block length.

An open parenthesis and a close parenthesis corresponding to the open parenthesis in the BP representation of FIG. 4C, indicate a node. The node position of FIG. 4C indicates a number of a node using the bit position as a start point, and the node position corresponds to a node number of the tree structure of FIG. 4B. Here, in the bit string illustrated in FIG. 4C, the bit position increases from left to right, but in physical block data stored in a register of the RAM or the CPU, the bits are sequentially arranged in bits of high-order digits of the RAM or the register, as a number of the bit position increases. In the bit string illustrated in FIG. 4C, bits on the right side are stored in high-order digits of the RAM or the register.

<Block Encoding Processing>

Hereinafter, the block encoding processing of binary data corresponding to this embodiment will be described. In this embodiment, the block encoding processing indicates processing of converting blocks X to be processed configured of an arbitrary bit string having a block length n, into the values of the weight w included in the block X and the order OD of the blocks to be processed. In a mathematical expression, the block encoding processing will be represented as follows.

$$\text{ENCODE}(X) = (w, OD) \qquad \text{(Expression 1)}$$

Here, the weight indicates the number of "1" included in the bit string. In addition, the order indicates a value indicating a sequence of positioning the blocks X to be processed in a set (BITS(n, w)) of the bit string having the weight w and block length n.

Figure 5:
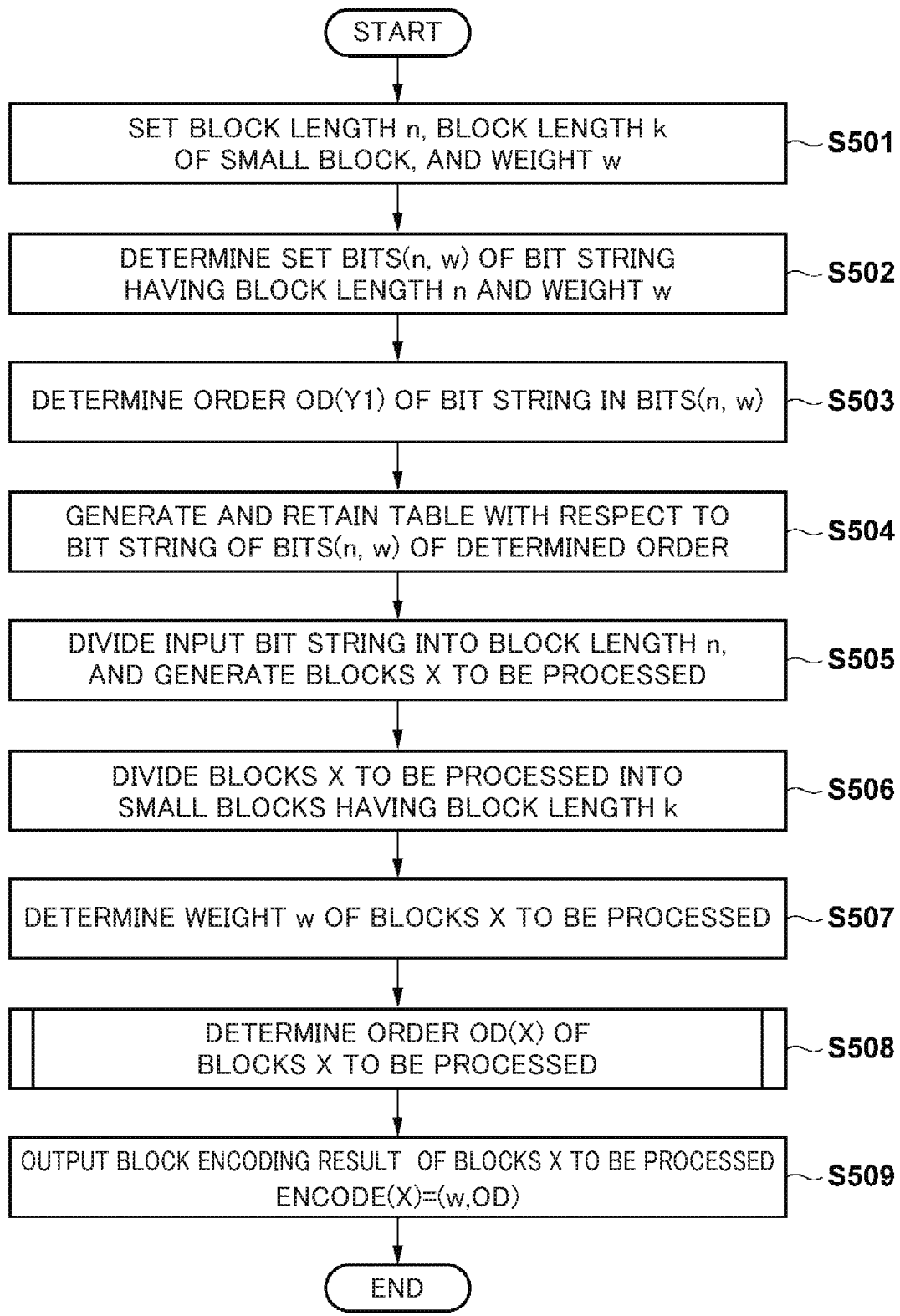
FIG. 5 is a flowchart illustrating an example of block encoding processing corresponding to the embodiment of the present invention.

FIG. 5 is a flowchart illustrating an example of the block encoding processing. Processing corresponding to the flowchart is executed by the block encoding unit 301, the table generating unit 303, and the table retaining unit 304.

First, in S501, the table generating unit 303 sets the block length n of the blocks to be processed, a block length k of each small block configuring the blocks to be processed, and the weight w of the blocks to be processed. In this embodiment, the blocks to be processed having the block length n is equally divided by the small block having the block length k. The weight w is a weight with respect to the entire binary data of the block length n, and the weight for each small block is not limited. The range of the weight w is $0 \leq w \leq n$. For example, in a case where the weight w is 2, two "1" are included in the blocks to be processed.

Next, in S502, the table generating unit 303 determines the set BITS(n,w) of the bit string which is capable of existing, with respect to the binary data of the block length n and the weight w determined in S501. At this time, the number of bit strings included in BITS(n,w) is set to I. I can be obtained by the following expression.

$$I = C(n, w) \qquad \text{(Expression 2)}$$

Here, C(n, w) indicates a combination $_nC_w$ for selecting w from n.

Subsequently, in S503, an order $OD(Y_i)$ of binary data in BITS(n,w) which is determined by the table generating unit 303 in S502, is determined. Here, $Y_i$ indicates an arbitrary bit string included in BITS(n,w), and i is represented by an integer of greater than or equal to 0 and less than I ($0 \le i < I$). At this time, simultaneously, $0 \le OD(Y_i) < I$ is also established. Next, in S504, a table to be referred to as in the block encoding processing, is prepared with respect to the BITS (n,w) bit string of the order determined by the table generating unit 303 in S503, and is retained in the table retaining unit 304.

Next, in S505, the block encoding unit 301 divides the input bit string into the blocks having the block length n set in S501, and generates the blocks X to be processed.

Subsequently, in S506, the block encoding unit 301 divides the blocks X to be processed into the small blocks having the block length k.

Subsequently, in S507, the block encoding unit 301 determines the weight w on the basis of the number of "1" included in the bit string of the blocks X to be processed. Subsequently, in S508, the block encoding unit 301 determines the order OD(X) of the blocks X to be processed, with reference to the table retained by the table retaining unit 304. In the order $OD(Y_i)$ of the binary data in BITS(n,w) determined in S503, the order $OD(Y_i)$ of $X=Y_i$ may be specified as OD(X). In addition, the order OD(X) of X corresponds to the number of $Y_i$ in BITS(n, w) satisfying $OD(X) > OD(Y_i)$. In S509, the block encoding unit 301 outputs a block encoding result (ENCODE(X)=(w, OD)) of the blocks X to be processed, on the basis of OD(X) and the weight w.

In the steps described above, the processing from S501 to S504 may be executed in advance with respect to an arbitrary combination of n, k, and w, which are assumed before the input bit string is input.

Figure 6:
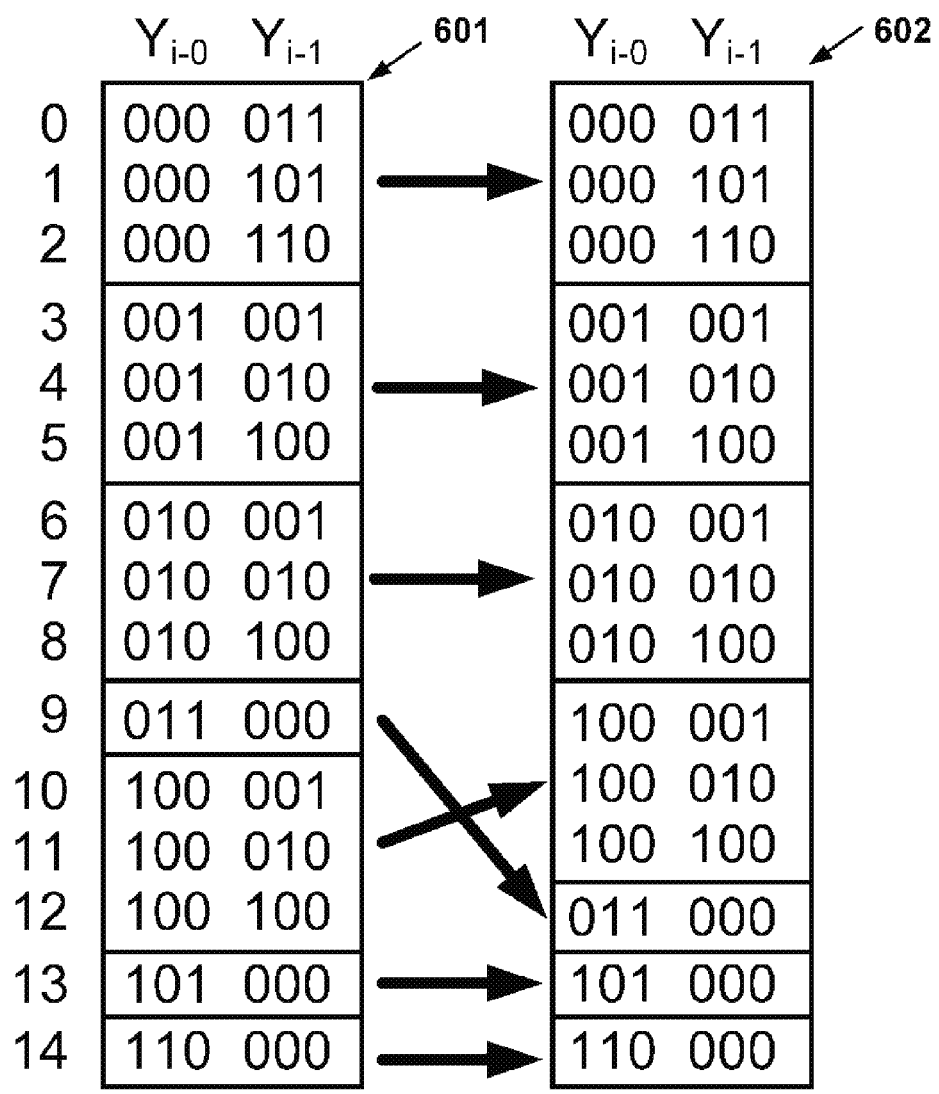
FIG. 6 is a diagram for illustrating an arrangement order of bit strings to be subjected to the block encoding processing, corresponding to the embodiment of the present invention.
Figure 8:
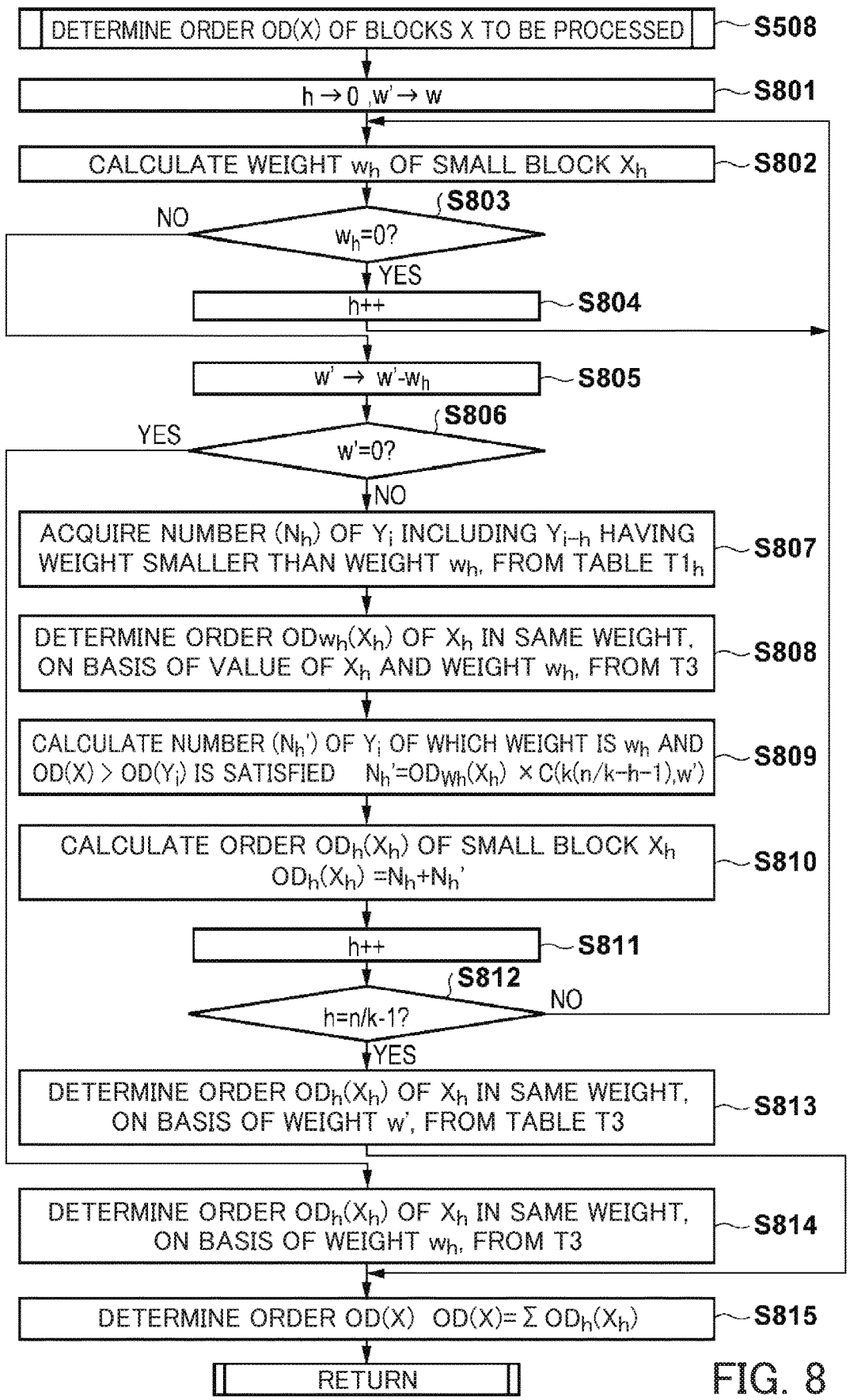
FIG. 8 is a flowchart illustrating an example of determination processing of an order OD(X), corresponding to the embodiment of the present invention.

Hereinafter, a specific example of the block encoding processing according to the flowchart of FIG. 5 will be described with reference to FIG. 6 and FIG. 7. FIG. 6 is a diagram for illustrating an arrangement order of bit strings to be subjected to the block encoding processing, and FIG. 7 is a diagram for illustrating each table referred to the block encoding processing and the block decoding processing.

First, in the following specific example, the block length n=6, the block length k of the small block=3, and the weight w=2 are set, with respect to the processing of S501. Furthermore, such numerical values are merely examples, and larger values may be used.

A pattern BITS(6,2) of a bit string $Y_i$ which is capable of existing in a case where the block length n is set to 6, is as shown in a left table 601 of FIG. 6, with respect to the processing of S502. The number I of bit strings is set to I=C(6,2)=15 such that two "1" are included in the blocks to be processed of 6 bits. In the bit string $Y_i$, $Y_0$ to $Y_{14}$ exist, and in the left table 601 of FIG. 6, data is indicated in ascending sequence, in the order in which "1" exists from the lowest-order bit side. The order sequentially corresponds to the size of the bit string $Y_i$. Numbers of 0 to 14 shown on the left side of the table indicate the order which is allocated into each binary data item shown in the table. Here, the position of "1" is determined with respect to the entire block of 6 bits.

In response, in this embodiment, in the processing of S503, the arrangement of 15 bit strings $Y_i$ is shuffled on the basis of the value for each small block having the block length k=3 ($Y_{i-0}$, $Y_{i-1}$), and the order $OD(Y_i)$ is determined. A right table 602 of FIG. 6 shows the result of shuffling the order of the blocks. Here, the order from the 0-th to the 8-th is not changed, but the order from the 9-th to the 12-th is shuffled. In the right table 602, the order of the blocks to be processed is determined in ascending sequence, on the basis of the weight and the value of the bit of the small block unit, from the highest-order bit side. Here, the order based on the weight w is in the order of w=0, 1, and 2. In addition, the order based on the value, for example, is in the order of "001", "010", and "100" in the case of a weight 1, and is in the order of "011", "101", and "110" in the case of a weight 2. In the example of FIG. 6, a group of weights 0 such as "000", a group of the weights 1 such as "001", "010", and "100", and a group of the weights 2 such as "011", "101", and "110" are generated, and thus, the order is determined in sequence of such groups.

In FIG. 6, a case where the block length n of the blocks to be processed is 6 bits, is described, but the order determination method described above can be similarly applied to a case where the block length n, the small block length k, and the weight w are changed. For example, even in a case where the block length n increases, the weights sequentially decrease from the small block positioned on the highest-order bit side, and are arranged in ascending sequence, in the order from a small value.

Subsequently, in S504, the table generating unit 303 generates a table which is referred to in the block encoding processing, with respect to the bit string of the order determined in S503. The table generating unit 303 is capable of generating five types of table as illustrated in FIG. 7.

In a first table (T1) 701 illustrated in FIG. 7, the number of $Y_i$ having a smaller weight is registered in each weight w of a block $Y_{i-0}$, with respect to a small block $Y_{i-0}$ on the highest-order bit side. First, there is no weight smaller than the weight 0, and thus, a value of an entry of a head of $T1_0$ is 0. Next, there are three bit strings $Y_i$ having the weight 0 smaller than the weight 1, and thus, the value of the entry of $T1_0$ for the weight 1 is 3. Similarly, there are twelve bit strings $Y_i$ having the weight 0 and the weight 1 smaller than the weight 2, and thus, the value of the entry of $T1_0$ for the weight 2 is 12. In addition, in the example of FIG. 7, the weight 3 does not exist, and thus, is invalid as a value, but in a case where the weight 3 exists, the corresponding value is registered.

In FIG. 7, the case of the block length n=6, and the small block length k=3, is described, but in a case where T1 is generated with respect to a longer block length, the number of $Y_i$ having a smaller weight is registered in each weight w, with respect to each of n/k−1 small blocks from the highest-order bit side. Each of the values can be obtained by the following expression.

$$T1[x][y][z] = \Sigma_{v\ in\ [0\ \ldots\ z]} C(k,v) \times C(k \times x, y-v), x\ in\ [0\ \ldots\ n/k], y\ in\ [0\ \ldots\ w], z\ in\ [0\ \ldots\ k] \quad \text{(Expression 3)}$$

Next, in a second table (T2) 702, the number of combinations in the small block (the small block length k) based on the value of the weight w is registered. Here, the weight w=2 is satisfied, and thus, the number of "1" which is capable of existing in the small block is any one of "0", "1", and "2". In addition, the small block length k=3 is satisfied. Accordingly, an entry of a head of T2 is C(3,0), and indicates that "1" does not exist in a block of 3 bits configuring the small block. There is only one value of "000" as the number of combinations, and thus, a value to be registered is "C(3,0)=1". Next, in a case where one pattern of "1" exists in the block of 3 bits configuring the small block, there are three patterns of "001", "010", and "100", and thus, a value to be registered is "C(3,1)=3". Similarly, in a case where two "1" exist in the block of 3 bits configuring the small block, there are three patterns of "011", "101", and "110", and thus, a value to be registered is "C(3,2)=3".

In addition, the embodiments of the present invention are not limited to such examples, and the values according to the size of the block length n, the small block length k, and the weight w are registered in T2. Each of the values can be obtained by the following expression.

$$C(k \times x, y) \ (x \text{ in } [0 \ldots n/k], y \text{ in } [0 \ldots w])$$ (Expression 4)

Next, in a third table (T3) 703, a value of an order which is allocated into different bit patterns according to the weight, is registered, with respect to the small block length k. An order of a bit string X is indicated by $OD_{sw}(X)$, as an order in the same weight registered in T3. Here, the case of k=3 is described, but for example, in the case of the weight 0 and the weight 3, only "000" and "111" exist, and thus, it is not necessary to register a value, or $OD_{sw}(000)=0$ and $OD_{sw}(111)=0$ are registered. In addition, in the case of the weight 1 and the weight 2, the bit pattern is different according to a position of acquiring "1" in the block of 3 bits. In the case of the weight 1, three patterns of "001", "010", and "100" exist, and in the case of the weight 2, three patterns of "011", "101", and "110" also exist. In such an order, the values of "0", "1", and "2" are allocated. For example, $OD_{sw}(001)=0$, $OD_{sw}(010)=1$, and $OD_{sw}(100)=2$ are obtained. In addition, $OD_{sw}(011)=0$, $OD_{sw}(101)=1$, and $OD_{sw}(110)=2$ are obtained.

The value of the order $OD_{sw}(X)$ exists before the small block of the bit string into which the order is allocated, and indicates the number of small blocks having the same weight. For example, an order allocated into "001" is "0", and indicates that the small block having the same weight does not exist before the small block of "001". In addition, an order allocated into "100" is "2", and indicates that two small blocks having the same weight ("001" and "0101") exist before the small block of "100". In addition, the embodiments of the present invention are not limited to such examples, and the values according to the size of the small block length k and the weight w are registered in T3, and in the case of the same weight, the order is determined in ascending sequence, on the basis of the size of the value.

Next, in a fourth table T4 (704), a bit string corresponding to a combination of a rank and a value of a weight applied into the same weight, is registered, with respect to the bit string having the small block length k. In FIG. 7, a bit string corresponding to a combination with respect to the bit string X of k=3, and a registration order thereof are registered in association with each other, and in this embodiment, the bit string is indicated by $BITs_{k=3}(w, OD_{sw})$. In this case, the weight w is capable of taking values of 0 to 3, and there are eight patterns of the bit string which is capable of existing. Each bit string can be uniquely specified by the value of the weight (0 to 3), and the order $OD_{sw}$ (0 to 2) allocated into the same weight. For example, in the case of the weight 0, $BITs_{k=3}(0, 0)=000$ is satisfied. In addition, in the case of the weight 1, a bit string to be obtained is any one of "001", "010", and "100", and one bit string in "001", "010", and "100" is specified on the basis of the value of the order. For example, in the case of the order $OD_{sw}=1$, $BITs_{k=3}(1, 1)=010$ is satisfied. Here, the order $OD_{sw}$ to be applied to the bit string X for each of the same weights, is the order of the size of the value of the bit string, as with the table T3.

In addition, even though it is not illustrated in FIG. 7, a value indicating the registration order in the table T4 for specifying a bit string having the same weight on the head of the order $OD_{sw}$ within the table T4, on the basis of the value of the weight w, may be registered in advance in the table T4, or may be retained by the table retaining unit 304. The value can be obtained by $OD_w=\Sigma(3,w-1)$, with respect to $BITs_{k=3}(w, OD_{sw})$ (here, in the case of w=0, 0). For example, in the case of k=3, a weight to be obtained is 0 to 3, and thus, in the case of the weight 0, $OD_{w=0}=0$ is satisfied, in the case of the weight 1, $OD_{w=1}=C(3, 0)=1$ is satisfied, in the case of the weight 2, $OD_{w=2}=C(3, 0)+C(3, 1)=4$ is satisfied, and in the case of the weight 3, $OD_{w=3}=C(3, 0)+C(3, 1)+C(3, 2)=7$ is satisfied. Among them, in a case where the weight w is 2, $OD_{w=2}=4$ is satisfied, and thus, it is known that a bit string corresponding to the weight 2 is registered from a position where the registration order of the table T4 is "4". In FIG. 7, "011" to "110" of which the registration order is 4 to 6, correspond to the weight 2. Then, the bit string can be specified according to the value of the order $OD_{sw}$ from a head entry of "011" in the same weight. For example, in the case of the order $OD_{sw}=2$, the head to the second entry (110) are the bit string to be specified.

In summary, for example, in the case of (w, $OD_{sw}$)=(2, 1), the registration order of the table T4 is satisfied as $OD_{w=2}+OD_{sw}=4+1=5$, and thus, $BITs_{k=3}(2, 1)=101$ can be selected.

Next, in a fifth table T5 (705), the value of the weight of the bit string having the small block length k is registered. In FIG. 7, the bit string X of k=3 is illustrated, and in this embodiment, the order is indicated by $W_{k=3}(X)$. For example, a bit string of "000" having the weight 0 is $W_{k=3}(000)=0$, and a bit string of "101" having the weight 2 is $W_{k=3}(101)=2$. The tables T1 to T5 the generated as described above, are retained by the table retaining unit 304.

Next, first, the processing of S508, in which the block encoding unit 301 determines the order OD(X) in BITS(6,2) of the blocks X to be processed, will be conceptually described. Specifically, the block encoding unit 301 calculates the number of bit strings Yi positioned before the blocks X to be processed in the order determined in S503, in BITS(6,2). At this time, the small block configuring the blocks X to be processed is indicated by $X_0$ and $X_1$, and a small block of an arbitrary bit string $Y_i$ other than the blocks X to be processed included in BITS(6,2) is indicated by $Y_{i\text{-}0}$ and $Y_{i\text{-}1}$.

First, the number of $Y_i$ satisfying $OD(X_0) > OD(Y_{i\text{-}0})$ is calculated by a small block $X_0$. For example, in the bit strings shown in the right table 602 of FIG. 6, in a case where the blocks X to be processed are set to "011000" of an order of "12", $X_0$ is "011", and in the example of the right table of FIG. 6, the number of $Y_i$ satisfying $OD(X_0) > OD(Y_{i\text{-}0})$ is 12. Then, the other $Y_i$ satisfying $X_0=Y_{i\text{-}0}$ does not exist, and thus, "12" is the order of the blocks X to be processed as it is.

In addition, in a case where the blocks X to be processed are set to "100010" of an order of "10", $X_0$ is "100", and in the example of the right table 602 of FIG. 6, the number of $Y_i$ satisfying $OD(X_0) > OD(Y_{i\text{-}0})$ is 9. Then, three $Y_0$ satisfying $X_0=Y_{i\text{-}0}$ exist, and among them, in a case where the number of $Y_i$ satisfying $OD(X_1) > OD(Y_{i\text{-}1})$ is satisfied, the number of $Y_i$ is 1, and thus, the number of bit strings $Y_i$ smaller than the blocks X to be processed in BITS(6,2) is 10 according to 9+1. Accordingly, the block encoding unit 301 is capable of obtaining the order OD(X) of the blocks X to be processed as "10".

Thus, in this embodiment, the order OD(X) of the blocks X to be processed is determined in the order of the weight and the value, for each small block from the highest-order bit side. Next, an example of the determination processing of the order OD(X) in S508 referring to any one of five tables T1 to T5 of FIG. 7, which is executed on the basis of the concept described above, will be further described with reference to a flowchart of FIG. 8.

Hereinafter, the case of processing $Y_{10}=100010$ into which the order of "10" is allocated as the blocks X to be processed, will be described. First, in S801, the block encoding unit 301 initializes a parameter h indicating the position of each of the small blocks of the blocks X to be processed to 0. h is an integer value in a range of 0≤h<n/k−1. In an example of a bit string 602 of FIG. 6, h is values of 0 and 1. In addition, a parameter w' is initialized by the value of the weight w of the blocks X to be processed, which is determined in S507. In the example of FIG. 6, the weight w=2 is satisfied, and thus, the parameter w' is initialized to 2.

Next, in S802, the block encoding unit 301 calculates a weight $w_h$ from the value of a small block $X_h$. Here, $X_0=Y_{10-0}$ is "100", and thus, the weight $w_h$=1 is satisfied. At this time, the table T5 of FIG. 7 may be referred to. Subsequently, in S803, it is determined whether or not the weight $w_h$ is 0. In a case where the weight $w_h$ is 0 ("YES" in S803), the process proceeds to S804, and h is updated by 1, and then, the processing of S802 is performed with respect to the small block. On the other hand, in a case where the weight $w_h$ is not 0 ("NO" in S803), the process proceeds to S805. In the example of FIG. 6, $w_h$=1 is obtained, but $w_h$ is not 0, and thus, the process proceeds to S805.

In S805, the value of the parameter w' is updated by the value of w'−$w_h$. Accordingly, the value of the weight allocated into the blocks X to be processed is subtracted by the weight of each of the small blocks. In the example of FIG. 6, the value of w' is updated to 1 according to 2−1=1. Subsequently, in S806, it is determined whether or not w' is coincident with 0. In a case where w' is coincident with 0 ("YES" in S806), the process proceeds to S814. In S814, an order $OD_h(X_h)$ of $X_h$ is determined within values having the same weight as the weight $w_h$, from the table T3, and the process proceeds to S815. On the other hand, in a case where w' is not coincident with 0 ("NO" in S806), the process proceeds to S807. In FIG. 6, w'=1 is satisfied, but w' is not 0, and thus, the process proceeds to S807.

In S807, the block encoding unit 301 acquires the number ($N_h$) of $Y_i$ including a small block $Y_{i-h}$ having a weight smaller than the weight $w_h$ of the small block $X_h$, from a table $T1_h$. Here, the table $T1_h$ is prepared for each position h of the small block (0≤h<n/k−1), and a table 701 of FIG. 7 indicates the case of h=0. Here, in FIG. 7, a suffix h is omitted. In the example of the bit string 602 of FIG. 6, $X_0=Y_{10-0}$ is the weight $w_h$=1, and "3" is satisfied from a table $T1_0$ of h=0, as the number of bit strings $Y_i$ having a weight smaller than the weight 1, that is the weight 0. Subsequently, in S808, an order $OD_{sw}(X_h)$ of $X_h$ within the same weight is determined on the basis of the value of the small block $X_h$ and the weight $w_h$, from the table T3. In the example of FIG. 6, it is known that an order $OD_{sw}(100)$=2 of "100". After that, in S809, the number ($N_h'$) of $Y_i$ of which the weight is $w_h$, and the order $OD(Y_i)$ smaller than the order OD(X) of the blocks to be processed, is calculated by the following expression.

$$N_h'=OD_{sw}(X_h) \times C(k(n/k-h-1),w') \quad \text{(Expression 5)}$$

In the example of FIG. 6, $OD_{sw}(100)$=2, k(n/k−h−1)=3 (6/3−0−1)=3, and w'=1 are obtained, and thus, $N_h'$=2×C(3, 1)=2×3=6 is satisfied. Furthermore, the value registered in advance in the table T2, can be used as the value of C(k(n/k−h−1), w'). In the example of FIG. 6, the number of bit strings $Y_i$ existing before $Y_{10-0}$="100", which have the weight 1 and $Y_{i-0}$ of "001" and "010", is determined according to the calculation.

Next, in S810, the order $OD_h(X_h)$ of the small block $X_h$ is calculated on the basis of the following expression.

$$OD_h(X_h)=N_h+N_h' \quad \text{(Expression 6)}$$

In the example of FIG. 6, $N_h$=3 and $N_h'$=6 are obtained, and thus, $OD_0(X_0)$=9 can be obtained. Subsequently, in S811, h is updated by one, and in S812, it is determined whether or not the next small block is the final unprocessed small block of the blocks to be processed. In a case where it is not the final small block ("NO" in S812), the process returns to S802, and the processing is repeated. In a case where it is the final small block ("YES" in S812), the process proceeds to S813. In the example of FIG. 6, h=1 is satisfied, and the small block is the final small block, and thus, the process proceeds to S813.

In S813, the order $OD_h(X_h)$ of $X_h$ is determined in the same weight, on the basis of the value of the newest weight w' calculated in S805, from the table T3, and the process proceeds to S815. In the example of FIG. 6, an order $OD_1(010)$ of a small block $X_1$ of a bit string of "010" is specified to "1", according to the table T3. Next, in S815, the order OD(X) of the blocks X to be processed is calculated by summing the orders $OD_h(X_h)$ calculated with respect to each of the small blocks $X_h$ in S810, S813 or S814. In the example of FIG. 6, $OD_0(X_0)+OD_1(X_1)$=9+1=10 is satisfied, and thus, it is possible to obtain the order OD(X)=10 of the blocks X to be processed (100010). In the case of block encoding, the value of the weight w is attached in addition to the value of the order. In the example described above, w=2 is satisfied. Accordingly, in S509, the block encoding unit 301 is capable of performing the block encoding with ENCODE(X)=(2,10).

Furthermore, in a case where the block length n and the small block length k are a known value between an encoding side and a decoding side, it is not necessary to perform encoding with respect to such values, but in a case where the block length n and the small block length k are not a known value such values are simultaneously encoded. In this embodiment, it is described that the values of n and k are known.

<Block Decoding Processing>

Hereinafter, the block decoding processing of decoding the block encoding data by the block decoding unit 302 corresponding to this embodiment, will be described. The block decoding processing indicates processing of decoding the blocks X to be processed configured of the bit string having the original block length n, from the values of the weight w of the block encoding result and the order OD of the blocks X to be processed in this embodiment. In a mathematical expression, the block decoding processing will be represented as follows.

$$DECODE(w,OD)=X \quad \text{(Expression 7)}$$

Figure 9:
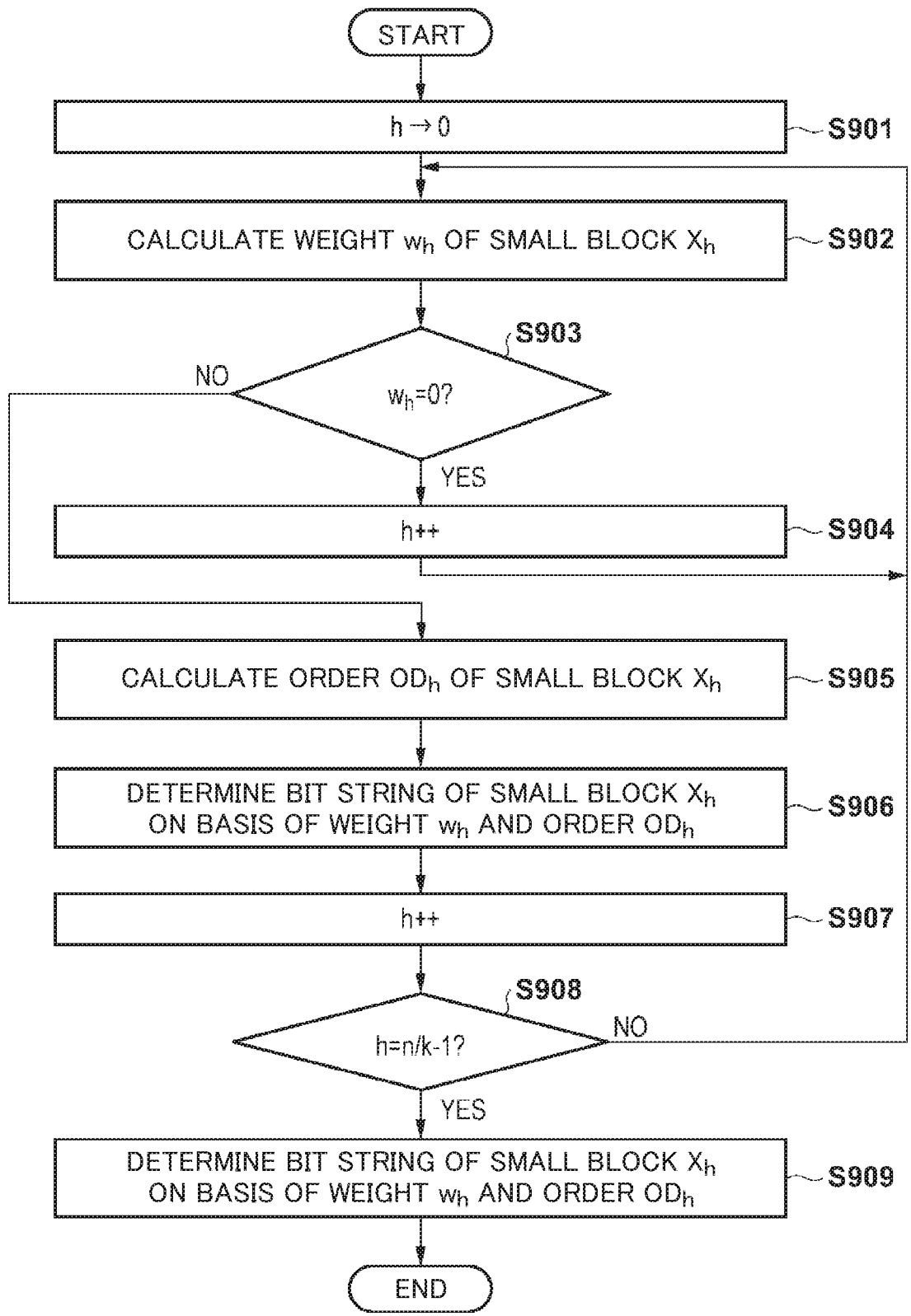
FIG. 9 is a flowchart illustrating an example of the block decoding processing corresponding to the embodiment of the present invention.

Hereinafter, a specific example of the block decoding processing in this embodiment will be described in detail, on the basis of a flowchart of FIG. 9, with reference to FIG. 6 and FIG. 7. Processing corresponding to the flowchart is executed by the block decoding unit 302, the table generating unit 303, and the table retaining unit 304.

First, in S901, the block decoding unit 302 initializes the parameter h indicating the position of the small block to 0. h is an integer value in a range of 0≤h<n/k−1.

Next, in S902, the block decoding unit 302 calculates the weight $w_h$ of the small block $X_h$. Here, a calculation expression is represented as follows.

$$w_h=\text{MAX}\{v \text{ in } [0 \ldots k] | T1[n/k-h-1][w][v] \le OD\} \quad \text{(Expression 8)}$$

More specifically, for example, in a case where (h=0) is satisfied immediately after h is initialized, here, a weight $w_0$ of the small block $X_0$ to be decoded, on the head, is calculated. As illustrated in FIG. 6, in a case where the block length is 6 bits, and the small block length is 3 bits, there are two small blocks of $X_0$ and $X_1$, and first, the weight $w_0$=weight($X_0$) for $X_0$ is calculated. In this case, a calculation expression of (Expression 8) is represented as follows.

$$w_0 = \text{MAX}\{j \text{ in } [0 \ldots k] | T1[j] \leq 10\} = 1 \text{ ($k$ indicates the block length of the small block)} \quad \text{(Expression 8-1)}$$

In the example of FIG. 7, in the weights registered in the table T1, in the case of the weight 0, T1[0]=0 is satisfied, in the case of the weight 1, T1[1]=3 is satisfied, in the case of the weight 2, P[2]=12 is satisfied, and T1[1] has a value less than or equal to order OD(X)=10, and thus, the weight is determined to 1.

In addition, the embodiments of the present invention are not limited such examples, and weight calculation processing can be executed according to the size of the block length n, the small block length k, and the weight w.

Next, in S903, it is determined whether or not the calculated weight $w_h$ is 0. In a case where the weight is 0 ("YES" in S903), the next small block is set to be processed, and in S904, the value of h is updated by one, the process returns to S902, and the weight is calculated again. In a case where the weight is not 0 ("NO" in S903), the process proceeds to S905.

In S905, the order $OD_h$=$OD(X_h)$ of the small block $X_h$ is calculated. Here, a calculation expression is represented as follows.

$$OD_h = (OD - T1[n/k-h-1][w][w_h])/T2[n/k-h-1][w-w_h] \quad \text{(Expression 9)}$$

More specifically, here, the small block $X_0$ has the weight 1, and thus, a value to be acquired is any one of "001", "010", and "100", and is determined on the basis of the order OD(X). The order $OD_0$ of the small block $X_0$ is obtained by the number of combinations (C(3,1)=3) of the bit pattern of the weight 1, included in a number obtained by subtracting the number of bit strings (3) of the weight 0 from the order OD(X)=10 of blocks to be decoded. At this time, the decimal point of a calculation result is suppressed. In this case, Expression 9 is represented as follows.

$$OD_0 = (OD(X) - T1[w_0])/C(3,1) = (10-3)/3 = 2 \quad \text{(Expression 9-1)}$$

Next, in S906, on the basis of the weight $w_h$ and $OD_h$ calculated in S902 and S906, a bit string of the small block $X_h$ is determined. From the calculation of S905, it is known that the small block $X_0$ has a pattern of an order 2 in the bit string of the weight 1. Accordingly, it is known that the registration order of the table T4 is $OD_{w=1} + OD_{sw} = 1 + 2 = 3$, and thus, $BITs_{k=3}(1, 2) = 100$ is selected from the table T4, the bit pattern of the small block $X_0$ is determined to 100, with respect to (w, $OD_{sw}$)=(1, 2) in relation to the table T4 of FIG. 7.

Next, in S907, the next small block is set to be processed, the value of h is updated by one, and in S908, it is determined whether or not h is coincident with n/k−1, that is, whether or not a small block including the lowest-order bit is set to be processed. In a case where the small block including the lowest-order bit is set to be processed ("YES" in S908), the process proceeds to S909, and in the other case ("NO" in S908), the process returns to S902, and continues the processing.

In S909, weight $w_h$ (h=n/k−1) is obtained by subtracting the weights which have been allocated into the small block so far, from the weights w of all of the blocks X included in the block encoding data. In addition, order $OD_h$ (h=n/k−1) is obtained by subtracting the orders which have been allocated into the small block so far, from the orders OD(X) of all of the blocks X included in the block encoding data.

For example, in the example of the bit string 602 of FIG. 6, the weight $w_1$ of the small block $X_1$ is calculated. The weight $w_1$ can be calculated by $w_1 = w - w_0 = 1$. In addition, a rank $OD_1$=$OD(X_1)$ of the small block $X_1$ is calculated. The small block $X_1$ also has the weight 1, and thus, a value to be acquired is any one of "001", "010", and "100", and is determined on the basis of the order OD(X). The order $OD_1$ of the small block $X_1$ is obtained by subtracting the number of bit strings (3) of the weight 0, and the number of bit strings ($OD_0 \times C(3,1)$) having bit patterns of "001" and "010" before the order 2, from a rank 10 of the blocks to be decoded. This is represented as follows.

$$OD_1 = (OD - T1[w_0] - OD_0 \times C(3,1)) = 10 - 3 - 2 \times 3 = 1 \quad \text{(Expression 10)}$$

Accordingly, in the bit pattern of the weight 1, it is known that the small block $X_1$ has a pattern of order 1, and thus, the registration order of the table T4 is $OD_{w=1} + OD_{sw} = 1 + 1 = 2$, with respect to (w, $OD_{sw}$)=(1, 1), and therefore, $BITs_{k=3}(1, 1) = 010$ is selected from the table T4, and the bit pattern of $X_1$ can be determined to 010.

As described above, it is possible to determine that the block X="100010" is obtained as a decoding result.

As described above, it is possible to perform the block encoding and the block decoding with respect to the blocks to be processed, having the predetermined block length n, small block length k, and weight w. In such an operation, in a case where k=lg(n) is set, calculation can be performed for Encoding: O(n/lg(n)) hours, Decoding: O(n lglg(n)/lg(n)) hours, by using a table of a $n^3 + o(n^3)$ bit region. Specifically, in a case where a dense input bit string in which the number of 1 is set to $0.5 \times 2^{28}$, and a sparse input bit string in which the number of 1 is set to $0.01 \times 2^{28}$ are processed, with respect to a random bit string having a length $2^{28}$ in a case where the block length n=64 is set, and k is 8 and 16, it is possible to speed up a RANK/SELECT manipulation by approximately 20%, compared to a known method in which the division small blocks is not performed. Accordingly, it is possible to speed up query performance with respect to the dense input bit string, and to provide more table query performance.

Other Embodiments

The present invention is not limited to the embodiments described above, and various modifications and variations can be performed without departing from the spirit and the scope of the present invention. Accordingly, in order to publicize the scope of the present invention, the following claims are attached. In addition, the information processing device according to the present invention can also be achieved by a program allowing one or more computer to function as the information processing device. The program can be provided/distributed by being recorded in a computer-readable (non-transitory) recording medium, or through an electric communication line.

The invention claimed is:

1. A block encoding device, comprising:
one or more processors; and
one or more memories storing a program,
wherein in a case where the program is executed by the one or more processors, the program allows the one or more processors to execute an operation of,
dividing an input bit string into a plurality of blocks having a first block length, and generating blocks to be processed,
determining a first weight of the blocks to be processed from the number of 1 values included in a bit string of the blocks to be processed, dividing the blocks to be processed into small blocks having a second block length, and determining a first order of the blocks to be processed in a set in which predetermined bit strings having the first block length and the first weight are arranged in a predetermined order, determining the predetermined order as such that in a case where the predetermined bit strings included in the set are divided into the small blocks having the second block length, a bit string having a small weight and value of each of the small blocks is positioned on a head side, in the order from a first small block side including the highest-order bit, and converting the bit string of the blocks to be processed into values of the determined first weight and first order, and generating block encoding data.

2. The block encoding device according to claim 1, wherein in a case where the program is executed by the one or more processors, and allows the one or more processors to determine the first order, the program allows the one or more processors to execute an operation of, referring to a first table of registering the number of bit strings having a small weight with respect to the first small block of the bit string, in the set, for each size of weights that the bit string having the first block length and the first weight is capable of taking within the small block having the second block length, and calculating a first number of bit strings which have a weight smaller than the weight of the bit string of the first small block of the blocks to be processed, and are positioned before the blocks to be processed in the predetermined order, with respect to the first small block of the bit string, in the set.

3. The block encoding device according to claim 2, wherein in a case where the program is executed by the one or more processors, and allows the one or more processors to determine the first order, the program allows the one or more processors to execute an operation of, referring to a second table of registering the number of patterns of a bit string that the small block is capable of taking, for each size of weights that the small block having the second block length is capable of taking, and a third table of registering an order to be determined between the patterns of the bit string that the small block is capable of taking, for each size of weights that the small block having the second block length is capable of taking, and calculating a second number of bit strings which include the first small block of the bit string having the same weight as that of the bit string of the first small block of the blocks to be processed and a different value, and are positioned before the blocks to be processed in the predetermined order, in the set.

4. The block encoding device according to claim 3, wherein in a case where the program is executed by the one or more processors, and allows the one or more processors to determine the first order, the program allows the one or more processors to execute an operation of, calculating a third number of bit strings which include the first small block of the bit string having the same value as that of the first small block of the blocks to be processed, and are positioned before the blocks to be processed in the predetermined order, in the set, with reference to the third table, and adding the first number, the second number, and the third number, and determining the first order.

5. A block decoding device, comprising:
one or more processors; and
one or more memories storing a program,
wherein in a case where the program is executed by the one or more processors, the program allows the one or more processors to execute an operation of decoding a bit string of blocks to be processed from block encoding data which is generated by performing block encoding with respect to the bit string of the blocks to be processed having a first block length and a first weight, the block encoding data includes the first weight, and a first order of the blocks to be processed in a set in which predetermined bit strings having the first block length and the first weight are arranged in a predetermined order, and the operation of decoding the bit string includes an operation of, determining a second weight of a first small block including the highest-order bit of the blocks to be processed, in a case where the blocks to be processed are divided into small blocks having a second block length, determining a first number of bit strings which have a weight smaller than the second weight, and are positioned before the blocks to be processed in the predetermined order, with respect to the first small block of the bit string, in the set, determining a bit string of the first small block of the blocks to be processed, and a second number of bit strings including the first small block having the same weight as that of the first small block of the blocks to be processed and a different value, in the set, on the basis of a difference between the first order and the first number, and determining a bit string of a second small block of the blocks to be processed, on the basis of a difference between the first weight and the second weight, and a difference between the first order, and the first number and the second number, in the set.

6. The block decoding device according to claim 5, wherein the predetermined order is determined such that in a case where the predetermined bit strings included in the set are divided into the small blocks having the second block length, a bit string having a small weight and value of each of the small blocks is positioned on a head side, in the order from the first small block side including the highest-order bit.

7. The block decoding device according to claim 6, wherein in a case where the program is executed by the one or more processors, and allows the one or more processors to determine a second weight of the first small block of the blocks to be processed, the program allows the one or more processors to execute an operation of, referring to a first table of registering the number of bit strings having a small weight with respect to the first small block of the bit string, in the set, for each size of weights that the bit string having the first block length and the first weight is capable of taking within the small block having the second block length, and selecting a weight in which a value is less than that of the first weight, and the number of bit strings associated with the registered weight is smaller than the number of first orders, in the weights registered in the first table, and in a case where the program allows the one or more processors to determine the first number of bit strings which are positioned before the blocks to be processed in the predetermined order, the program allows the one or more processors to execute an operation of, selecting the number of bit strings associated with the second weight in the first table.

8. The block decoding device according to claim 7, wherein in a case where the program is executed by the one or more processors, and allows the one or more processors to determine a bit string of the first small block of the blocks to be processed, the program allows the one or more processors to execute an operation of, referring to a second table of registering the number of patterns of a bit string that the small block is capable of taking, for each size of weights that the small block having the second block length is capable of taking, and a third table of registering a bit string corresponding to a combination of the size of the weights that the small block having the second block length is capable of taking, and an order to be determined between the patterns of the bit string that the small block is capable of taking, and calculating a second order for selecting the bit string in the third table, on the basis of the difference between the first order and the first number, and the number of patterns registered in association with the second weight in the second table, and determining a bit string corresponding to a combination of the second weight and the second order in the third table, as the bit string of the first small block.

9. The block decoding device according to claim 8, wherein in a case where the program is executed by the one or more processors, and allows the one or more processors to determine the second number, the program allows the one or more processors to execute an operation of, calculating the number of bit strings which include the first small block having the same weight as that of the first small block of the blocks to be processed and a different value, and are positioned before the blocks to be processed in the predetermined order, in the set, on the basis of the difference between the first order and the first number, and the number of patterns registered in association with the second weight in the second table.

10. The block decoding device according to claim 9, wherein in a case where the program is executed by the one or more processors, and allows the one or more processors to determine the bit string of the second small block of the blocks to be processed, the program allows the one or more processors to execute an operation of, calculating a third order for selecting the bit string in the third table, on the basis of the difference between the first order, and the first number and the second number, and determining a bit string corresponding to a combination of the weight indicated by the difference between the first weight and the second weight, and the third order in the third table, as the bit string of the second small block.

11. An information processing device, comprising:
the block encoding device according to claim 1; and
a block decoding device, comprising:
one or more decoding processors; and
one or more memories storing a decoding program, wherein in a case where the decoding program is executed by the one or more decoding processors, the decoding program allows the one or more decoding processors to execute an operation of decoding a bit string of blocks to be processed from block encoding data which is generated by performing block encoding with respect to the bit string of the blocks to be processed having a first block length and a first weight, the block encoding data includes the first weight, and a first order of the blocks to be processed in a set in which predetermined bit strings having the first block length and the first weight are arranged in a predetermined order, and the operation of decoding the bit string includes an operation of, determining a second weight of a first small block including the highest-order bit of the blocks to be processed, in a case where the blocks to be processed are divided into small blocks having a second block length, determining a first number of bit strings which have a weight smaller than the second weight, and are positioned before the blocks to be processed in the predetermined order, with respect to the first small block of the bit string, in the set, determining a bit string of the first small block of the blocks to be processed, and a second number of bit strings including the first small block having the same weight as that of the first small block of the blocks to be processed and a different value, in the set, on the basis of a difference between the first order and the first number, and determining a bit string of a second small block of the blocks to be processed, on the basis of a difference between the first weight and the second weight, and a difference between the first order, and the first number and the second number, in the set.

12. A non-transitory computer readable medium storing a program for allowing a computer to execute the operation of the one or more processors of the block encoding device according to claim 1.

13. A non-transitory computer readable medium storing a program for allowing a computer to execute the operation of the one or more processors of the block decoding device according to claim 5.

14. A block encoding method to be executed by a block encoding device including one or more processors, and one or more memories storing a program, by allowing the one or more processors to execute the program, the method comprising:

dividing an input bit string into a plurality of blocks having a first block length, and generating blocks to be processed;

determining a first weight of the blocks to be processed from the number of 1 values included in a bit string of the blocks to be processed;

dividing the blocks to be processed into small blocks having a second block length, and determining a first order of the blocks to be processed in a set in which predetermined bit strings having the first block length and the first weight are arranged in a predetermined order, determining the predetermined order as such that in a case where the predetermined bit strings included in the set are divided into the small blocks having the second block length, a bit string having a small weight and value of each of the small blocks is positioned on a head side, in the order from a first small block side including the highest-order bit, and converting the bit string of the blocks to be processed into values of the determined first weight and first order, and generating block encoding data.

15. A block decoding method of allowing a block decoding device including one or more processors, and one or more memories storing a program to decode a bit string of blocks to be processed from block encoding data which is generated by performing block encoding with respect to the bit string of the blocks to be processed having a first weight and a first block length, by allowing the one or more processors to execute the program, the block encoding data including the first weight, and a first order of the blocks to be processed in a set in which predetermined bit strings having the first block length and the first weight are arranged in a predetermined order, the method comprising:

determining a second weight of a first small block including the highest-order bit of the blocks to be processed, in a case where the blocks to be processed are divided into small blocks having a second block length, determining a first number of bit strings which have a weight smaller than the second weight, and are positioned before the blocks to be processed in the predetermined order, with respect to the first small block of the bit string, in the set, determining a bit string of the first small block of the blocks to be processed, and a second number of bit strings including the first small block having the same weight as that of the first small block of the blocks to be processed and a different value, in the set, on the basis of a difference between the first order and the first number, and determining a bit string of a second small block of the blocks to be processed, on the basis of a difference between the first weight and the second weight, and a difference between the first order, and the first number and the second number, in the set.

* * * * *